(12) United States Patent
Ahn et al.

(10) Patent No.: US 6,803,326 B2
(45) Date of Patent: *Oct. 12, 2004

(54) POROUS SILICON OXYCARBIDE INTEGRATED CIRCUIT INSULATOR

(75) Inventors: Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/909,532

(22) Filed: Jul. 20, 2001

(65) Prior Publication Data

US 2002/0048968 A1 Apr. 25, 2002

Related U.S. Application Data

(63) Continuation of application No. 08/950,319, filed on Oct. 14, 1997.

(51) Int. Cl.[7] .......................... H01L 21/31; H01L 21/469
(52) U.S. Cl. ....................... 438/778; 438/623; 438/780; 438/781; 438/931
(58) Field of Search ............................... 438/623, 778, 438/780, 781, 692, 931; 257/77

(56) References Cited

U.S. PATENT DOCUMENTS

| | | | |
|---|---|---|---|
| 4,981,820 A | 1/1991 | Renlund et al. | 501/39 |
| 5,103,288 A | 4/1992 | Sakamoto et al. | 357/71 |
| 5,177,567 A | 1/1993 | Klersy et al. | 257/4 |
| 5,180,694 A | 1/1993 | Renlund et al. | 501/12 |
| 5,380,553 A | 1/1995 | Loboda | 427/226 |
| 5,470,802 A | 11/1995 | Gnade et al. | 437/238 |
| 5,488,015 A | 1/1996 | Havemann et al. | |
| 5,494,858 A | 2/1996 | Gnade et al. | 437/231 |
| 5,504,042 A | 4/1996 | Cho et al. | 437/247 |
| 5,525,857 A | 6/1996 | Gnade et al. | 313/309 |
| 5,527,737 A | 6/1996 | Jeng | 437/195 |
| 5,530,581 A | 6/1996 | Cogan | 359/265 |
| 5,598,026 A | 1/1997 | Kapoor et al. | 257/634 |
| 5,770,275 A * | 6/1998 | Raman et al. | 427/535 |

(List continued on next page.)

FOREIGN PATENT DOCUMENTS

| | | | |
|---|---|---|---|
| EP | 0684642 | 11/1995 | |
| EP | 0775669 | 5/1997 | ........... C01B/13/32 |
| EP | 0849796 | 6/1998 | ......... H01L/23/532 |
| JP | 10-150033 | 6/1998 | ......... H01L/21/312 |

OTHER PUBLICATIONS

Anand, M., et al., "NURA: A Feasible, Gas–Dielectric Interconnect Process", *Symp. on VLSI Technology Digest of Technical Papers*, 82–83, (1996).

(List continued on next page.)

*Primary Examiner*—Maria Guerrero
(74) *Attorney, Agent, or Firm*—Schwegman, Lundberg, Woessner & Kluth, P.A.

(57) ABSTRACT

An integrated circuit includes at least one porous silicon oxycarbide (SiOC) insulator, which provides good mechanical strength and a low dielectric constant (e.g., $\epsilon_R<2$) for minimizing parasitic capacitance. The insulator provides IC isolation, such as between circuit elements, between interconnection lines, between circuit elements and interconnection lines, or as a passivation layer overlying both circuit elements and interconnection lines. The low dielectric constant silicon oxycarbide isolation insulator of the present invention reduces the parasitic capacitance between circuit nodes. As a result, the silicon oxycarbide isolation insulator advantageously provides reduced noise and signal crosstalk between circuit nodes, reduced power consumption, faster circuit operation, and minimizes the risk of potential timing faults.

31 Claims, 4 Drawing Sheets

U.S. PATENT DOCUMENTS

| | | | |
|---|---|---|---|
| 5,789,819 A | 8/1998 | Gnade et al. | 257/759 |
| 5,818,071 A | 10/1998 | Loboda et al. | 257/777 |
| 5,821,621 A | 10/1998 | Jeng | 257/759 |
| 5,827,780 A | 10/1998 | Hsia et al. | 438/692 |
| 5,886,368 A * | 3/1999 | Forbes et al. | 257/77 |
| 5,981,303 A | 11/1999 | Gilton | 438/20 |
| 6,022,625 A | 2/2000 | Bremmer et al. | 428/447 |
| 6,054,751 A | 4/2000 | Ichikawa et al. | 257/532 |
| 6,163,066 A | 12/2000 | Forbes et al. | 257/632 |
| 6,187,604 B1 | 2/2001 | Gilton | 438/20 |
| 6,251,470 B1 | 6/2001 | Forbes et al. | 427/97 |
| 6,255,156 B1 * | 7/2001 | Forbes et al. | 438/235 |

OTHER PUBLICATIONS

Anderson, R., et al., "Porous Polycrystalline Silicon: A New Material for MEMS", *J. Microeletromechanical Systems*, 3, 10–18, (Mar. 1994).

Singh, A., et al., "Porous Silicon Oxycarbide Glasses", *J. Am. Ceram. Soc.*, 79, 2696–2704, (1996).

Togo, M., et al., "A Gate–side Air–gap structure (GAS) to Reduce the Parasitic Capacitance in MOSFETs", *Symp. on VLSI Technology Digest of Technical Papers*, 38–39, (1996).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

* cited by examiner

POROUS SILICON OXYCARBIDE
INTEGRATED CIRCUIT INSULATOR

CROSS REFERENCE TO RELATED
APPLICATIONS

This application is a continuation of U.S. patent application Ser. No. 08/950,319, filed on Oct. 14, 1997, the specification of which is incorporated herein by reference.

TECHNICAL FIELD OF THE INVENTION

This invention relates generally to integrated circuits, and particularly, but not by way of limitation, to a low dielectric constant porous silicon oxycarbide integrated circuit insulator for providing electrical isolation between interconnection lines and other integrated circuit components.

BACKGROUND OF THE INVENTION

Integrated circuits (IC's) typically include transistors and other circuit elements that are conductively interconnected in particular circuit configurations to provide desired circuit functions. Particular circuit elements and interconnection lines must be electrically isolated from other circuit elements and interconnection lines for proper IC operation. Modern IC technology includes insulating isolation layers. Such insulating isolation layers may be formed between transistors, between interconnection lines formed simultaneously, between interconnection lines formed as separate layers, between transistors and overlying interconnection lines, and as a passivation layer protecting underlying circuit elements and interconnection lines.

Good IC insulators should provide, among other things, low leakage currents, good mechanical strength, and low permittivity. In particular, a low permitivitty insulator (also referred to as having a low relative or absolute dielectric constant) presents reduced parasitic capacitance between circuit nodes. Since parasitic capacitance between circuit nodes increases noise coupling and signal crosstalk between circuit nodes, increases power consumption, slows circuit operation, and potentially introduces timing faults, the parasitic capacitance associated with insulating IC isolation layers should be minimized.

Trends in modern semiconductor technology are increasing the importance of minimizing the parasitic capacitance of IC isolation layers. Consumers demand high speed operation of computer and memory IC's. Battery powered portable computer and communications devices demand low power consumption for prolonged operation between battery recharges. Portability also requires more dense circuits so that more functionality can be provided in a smaller product. As circuits become more dense, interconnection lines are more closely spaced, making signal crosstalk between circuit nodes a greater concern. IC isolation layers that minimize parasitic capacitance are essential to continued advancement in semiconductor technology.

One popular IC insulator, silicon dioxide ($SiO_2$) has a relative dielectric constant ($\epsilon_r$) of approximately 4.0. A smaller relative dielectric constant reduces the parasitic capacitance between circuit nodes. Ideally, the relative dielectric constant of an IC isolation layer should be reduced such that it approaches the relative dielectric constant of air ($\epsilon_r$=1). Previous attempts to minimize parasitic capacitance have included forming air-gap dielectric structures having a relative dielectric constant approaching the relative dielectric constant of air ($\epsilon_r$=1). Air-gap structures, however, tend to lack the mechanical strength needed to support overlying interconnection and isolation layers of high physical integrity. For the reasons stated above, and for other reasons that will become apparent upon reading the following detailed description of the invention, there is a need for providing a low dielectric constant IC insulator having better mechanical strength.

SUMMARY OF THE INVENTION

The present invention provides, among other things, a low dielectric constant IC insulator formed of porous silicon oxycarbide. In one embodiment, the invention includes an integrated circuit formed on a substrate. A plurality of transistors is formed on the substrate. A patterned first conductive layer interconnects ones of the transistors. A porous silicon oxycarbide layer insulates portions of the first conductive layer from the transistors. In another embodiment, the invention includes an integrated circuit having a porous silicon oxycarbide layer overlying the circuit elements for protecting the physical integrity of the circuit elements.

Another aspect of the present invention provides a method of fabricating an integrated circuit. A working surface of a semiconductor substrate is coated with a mixture of oxide and carbon sources. The mixture of oxide and carbon sources is heated and dried such that the mixture of oxide and carbon sources is transformed into an insulator layer on the integrated circuit. In one embodiment, the mixture of oxide and carbon sources includes polymeric precursors such as substituted alkoxysilanes. In another embodiment, the substituted alkoxysilanes are mixed with silicon alkoxides. In a further embodiment, the mixture of oxide and carbon sources includes methyldimethoxysilane (MDMS) and tetraethoxysilane (TEOS). In another embodiment, heating and drying the mixture of oxide and carbon sources comprises pyrolyzing the mixture of oxide and carbon sources.

The low dielectric constant porous silicon oxycarbide insulator provides electrical isolation, such as between circuit elements, between interconnection lines, between circuit elements and interconnection lines, or as a passivation layer overlying both circuit elements and interconnection lines. The low dielectric constant porous silicon oxycarbide insulator of the present invention reduces the parasitic capacitance between circuit nodes. As a result, the porous silicon oxycarbide insulator advantageously provides reduced noise and signal crosstalk between circuit nodes, reduced power consumption, faster circuit operation, and minimizes the risk of potentially introducing timing faults. Other advantages will also become apparent upon reading the following detailed description of the invention.

BRIEF DESCRIPTION OF THE DRAWINGS

In the drawings, like numerals describe substantially similar components throughout the several views.

DETAILED DESCRIPTION OF THE INVENTION

Figure 1:
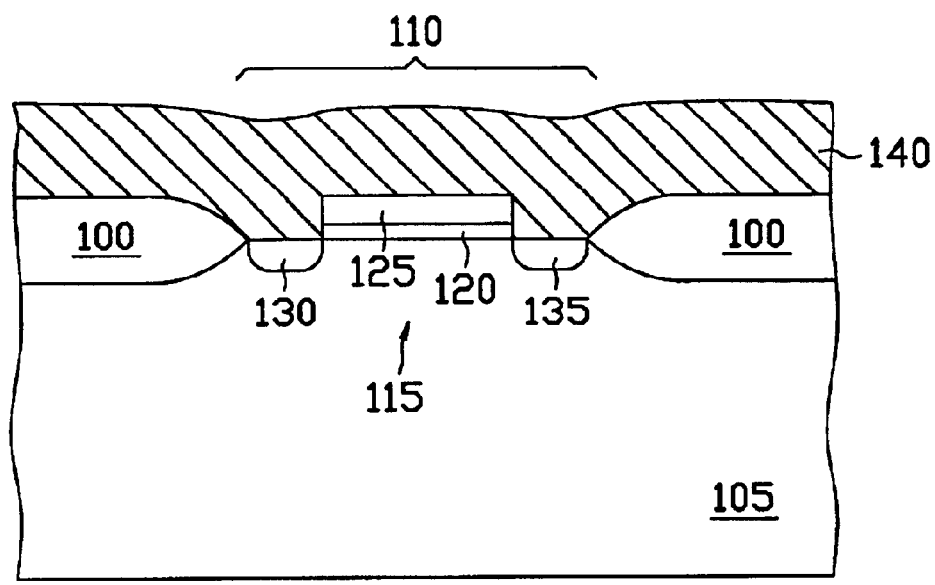
FIG. 1 is a cross-sectional view illustrating generally one embodiment of forming a low dielectric constant insulator.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The present invention provides a low dielectric constant porous silicon oxycarbide insulator suitable for isolation on any integrated circuit (IC), including, but not limited to: volatile and nonvolatile memory ICs, application-specific ICs (ASICs), microprocessor ICs, analog ICs, digital ICs, and communication ICs. The insulator provides electrical isolation, such as between circuit elements, between interconnection lines, between circuit elements and interconnection lines, or as a passivation layer overlying both circuit elements and interconnection lines. As described above, and explained in detail below, the low dielectric constant porous silicon oxycarbide isolation insulator of the present invention reduces the parasitic capacitance between circuit nodes. As a result, the porous silicon oxycarbide isolation insulator advantageously provides reduced noise and signal crosstalk between circuit nodes, reduced power consumption, faster circuit operation, and minimizes the risk of potentially introduces timing faults. Other advantages will also become apparent upon reading the following detailed description of the invention.

FIG. 1 is a cross-sectional view illustrating generally, by way of example, but not by way of limitation, one embodiment of forming a low dielectric constant insulator according to one aspect of the invention. In FIG. 1, local oxidation of silicon (LOCOS) or other isolation technique is used to form silicon dioxide field oxide regions 100 on substrate 105 outside active area regions 110 in which circuit elements, such as field-effect transistor (FET) 115, are formed. FET 115 includes gate insulator 120, such as silicon dioxide formed by dry oxidation of substrate 105. FET 115 also includes a gate 125 electrode, such as conductively doped polysilicon formed by chemical vapor deposition (CVD). Gate 125 and gate insulator 120 are patterned and etched, such as for allowing the self-aligned ion-implantation formation of source 130 and drain 135. Insulator 140 is a low dielectric constant porous silicon oxycarbide insulator that, in this embodiment of the invention, provides isolation between a circuit element, such as FET 115, and overlying interconnection and other layers subsequently formed.

One method of forming a porous silicon oxycarbide glass for catalysts, absorbents, and supports for heterogeneous metal catalysts is described in A. K. Singh et al., "Porous Silicon Oxycarbide Glasses," J. Am. Ceram. Soc. Vol. 79, No. 10(1996), pp. 2696–2704, which is herein incorporated by reference. One method of forming insulator 140 includes applying a mixture of oxide and carbon sources to the working surface of the wafer, including structures already fabricated on substrate 105, such as by using spin-on glass (SOG) application techniques. In one embodiment, for example, the mixture of oxide and carbon sources includes polymeric precursors such as substituted alkoxysilanes in which one or more of the alkoxy groups are replaced by saturated (e.g., $CH_3$ and $C_2H_5$) or unsaturated (e.g., $C_6H_5$) "R" groups. In a further embodiment, for example, the mixture of oxide and carbon sources includes the substituted alkoxysilanes mixed with pure silicon alkoxides (e.g., tetramethoxysilane (TMOS) or tetraethoxysilane (TEOS)).

In one embodiment, by way of example, but not by way of limitation, the mixture of oxide and carbon sources is formed by mixing approximately 50% methyldimethoxysilane (MDMS) and approximately 50% tetraethoxysilane (TEOS). The MDMS and TEOS is mixed with ethanol, such as for a time period of approximately 6 hours. One embodiment uses a molar ratio of total silane (i.e., MDMS and TEOS) to ethanol of 1:2. The mixture of MDMS and TEOS is hydrolyzed in the presence of an acid, such as by providing water that is acidified with 1M hydrochloric acid to form a resulting gel.

After formation, the mixture of oxide and carbon sources is heated and dried to transform the mixture of oxide and carbon sources into insulator 140. In one embodiment, this includes drying the gel, such as at a temperature of 80 degrees Celsius. The gel is pyrolyzed in a flowing argon atmosphere, such as by heating at a temperature that is approximately between 450 degrees Celsius and 1200 degrees Celsius for a duration that is approximately between 0.5 hours and 24 hours, thereby forming resulting porous silicon oxycarbide insulator 140 on the working surface of the wafer.

According to one aspect of the present invention, silicon oxycarbide insulator 140 is porous and has a low relative dielectric constant ($\epsilon_r < 2.0$, such as $\epsilon_r = 1.6$). As a result, porous silicon oxycarbide insulator 140 provides less parasitic capacitance as compared to a silicon dioxide insulator, having a relative dielectric constant of $\epsilon_r = 4.0$, or as compared to a nonporous silicon oxycarbide, which typically has a relative dielectric constant of $\epsilon_r > 4.0$. As a result, the silicon oxycarbide isolation insulator advantageously provides reduced noise and signal crosstalk between circuit nodes, reduced power consumption, faster circuit operation, and minimizes the risk of potentially introducing timing faults.

Among other things, the porosity of the silicon oxycarbide insulator 140 provides a low relative dielectric constant, as described above. In one embodiment, the porosity results from tiny micropores, e.g., voids that are approximately uniformly distributed in the silicon oxycarbide insulator 140. In one embodiment, the voids are characterized as having an average diameter that is approximately between 20 angstroms and 300 angstroms. In one embodiment, for example, the voids have an approximate diameter of 200 angstroms. In another embodiment, for example, the voids have an approximate diameter of 30 angstroms. The 30 angstrom diameter micropores of silicon oxycarbide insulator 140 are significantly smaller than pores in a porous silicon dioxide insulator, which are typically gross features that have diameters on the order of several hundred or even thousands of angstroms. According to another aspect of the invention, the voids in the silicon oxycarbide insulator 140 are typically not contiguous, and are approximately uniformly distributed in silicon oxycarbide insulator 140.

The porosity of silicon oxycarbide insulator 140 can also be characterized in terms of surface area. According to one aspect of the invention, the surface area of silicon oxycarbide insulator 140 is approximately between 200 square meters per gram of the porous silicon oxycarbide and 450 square meters per gram of the porous silicon oxycarbide. In one embodiment, for example, the silicon oxycarbide insulator 140 has a surface area of approximately 300 square meters per gram of the porous silicon oxycarbide. Silicon oxycarbide insulator 140 is more porous than porous polysilicon, which has a surface area on the order of square centimeters per gram, and is also more porous than a porous silicon dioxide insulator. The high porosity and small pore size of silicon oxycarbide insulator 140 provides a low dielectric constant and good mechanical strength. Thus, parasitic capacitance is minimized, yet subsequent layers can be formed upon and supported by silicon oxycarbide insulator 140 without compromising its physical integrity.

The above-described method of forming a porous silicon oxycarbide insulator 140 for providing IC isolation is not limited to the specific embodiment illustrated in FIG. 1, but is understood to apply to the formation of any and all IC isolation structures, such as between circuit elements, between interconnection lines, between circuit elements and interconnection lines, or as a passivation layer overlying both circuit elements and interconnection lines. In one embodiment, by way of example, but not by way of limitation, field-oxide regions 100 are replaced by isolation regions that include a porous silicon oxycarbide insulator formed according to the above-described techniques, such as in combination with conventional silicon etching techniques forming islands in active areas 110.

Figure 2:
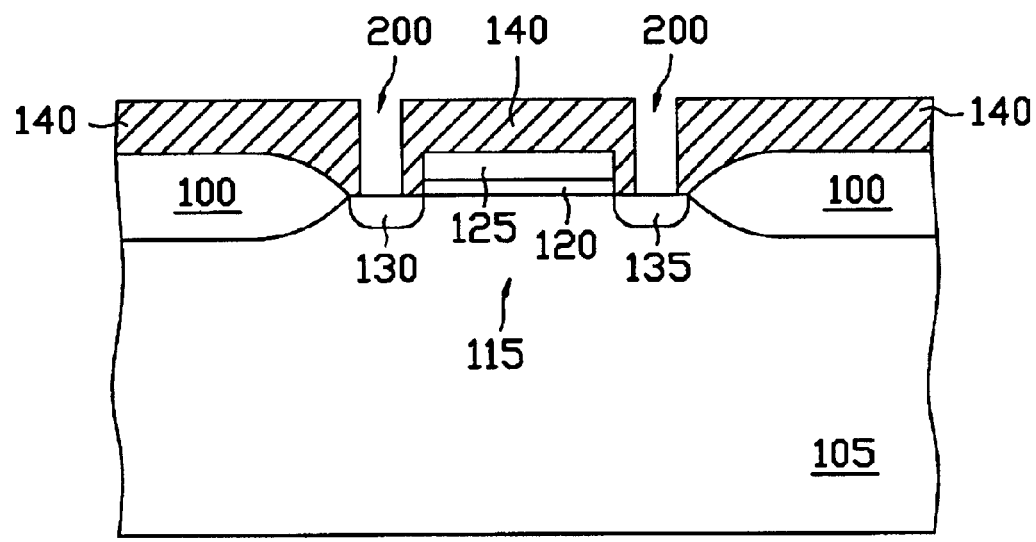
FIG. 2 is a cross-sectional view illustrating generally one embodiment of further processing of a porous silicon oxycarbide low dielectric constant insulator.

FIG. 2 is a cross-sectional view illustrating generally, by way of example, but not by way of limitation, one embodiment of further processing of porous silicon oxycarbide low dielectric constant insulator 140. In one embodiment, as illustrated in FIG. 2, a portion of porous silicon oxycarbide insulator 140 is removed, such as by chemical mechanical polishing (CMP), for planarizing or reducing the thickness of a remaining portion of porous silicon oxycarbide insulator 140. Contact holes 200 are formed by conventional patterning and etching techniques, such that source 130, drain 135 and gate 125 of FET 115 can be interconnected with other circuit elements or external (i.e., off-chip) circuit nodes. Subsequent processing follows conventional IC fabrication steps, except that other porous silicon oxycarbide insulating layers may be subsequently formed according to the general techniques described with respect to FIG. 1.

Figure 3:
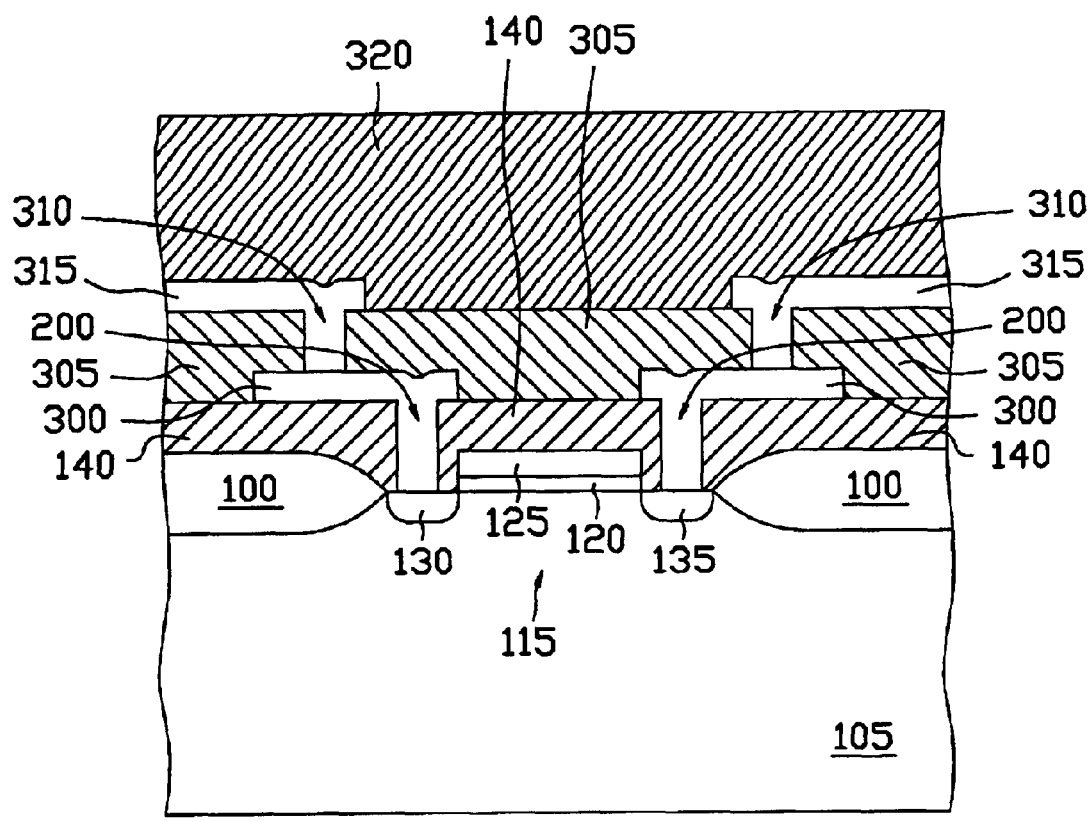
FIG. 3 is a cross-sectional view illustrating generally one embodiment of forming subsequent layers of a porous silicon oxycarbide insulator.

FIG. 3 is a cross-sectional view illustrating generally, by way of example, but not by way of limitation, one embodiment of forming subsequent layers of the porous silicon oxycarbide insulator according to the present invention. FIG. 3 illustrates a first metal layer 300, such as aluminum or refractory metal, formed on the working surface of the wafer. For example, first metal layer 300 contacts source 130 and drain 135 of FET 115. First metal layer 300 is patterned and etched for providing a desired interconnection between circuit elements. A porous silicon oxycarbide interlayer dielectric 305 is formed, such as according to the methods described above with respect to FIG. 1. Vias 310 are selectively formed in interlayer dielectric 305, such as by patterning and etching. A second metal layer 315, such as aluminum or refractory metal, is formed within vias 310 and elsewhere over the working surface of substrate 105. Second metal layer 315 is patterned and etched, such as for providing a desired interconnection between particular circuit elements or other interconnection lines. A porous silicon oxycarbide passivation layer 320 is formed, such as according to the methods described above with respect to FIG. 1. The porous silicon oxycarbide IC insulator of the present invention can also be used for isolation between any additional conductive layers in any fabrication process.

Figure 4:
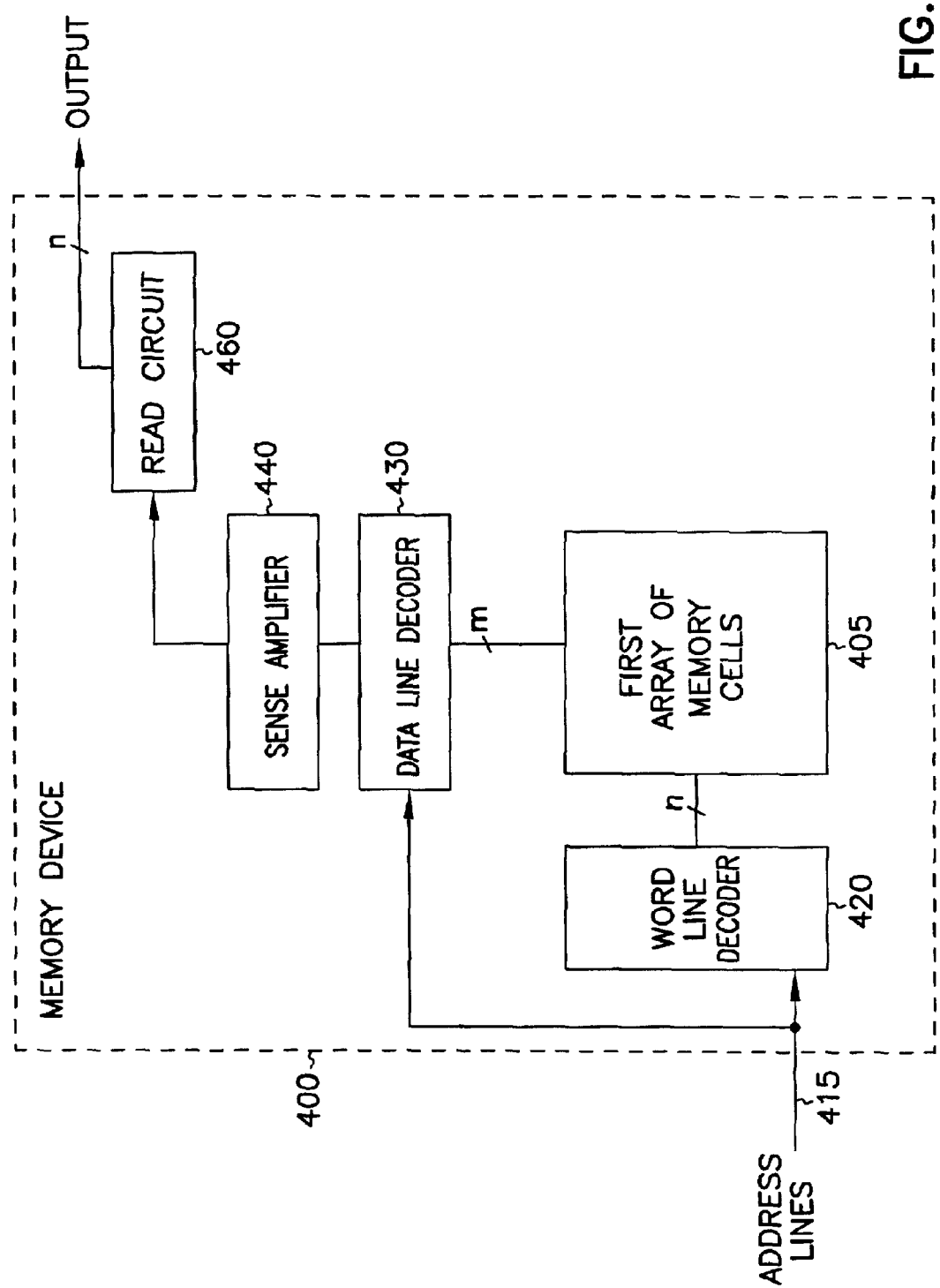
FIG. 4 is a schematic/block diagram that illustrates generally one embodiment of a memory device IC that includes a silicon oxycarbide insulator according to the present invention.

FIG. 4 is a schematic/block diagram that illustrates generally, by way of example, but not by way of limitation, one embodiment of a memory device 400 IC that includes a silicon oxycarbide insulator according to the present invention, such as described above. Memory device 400 includes an array of memory cells 405, address lines 415, a word line decoder 420, a data line decoder 430, a sense amplifier 440, and a read circuit 460.

Figure 5:
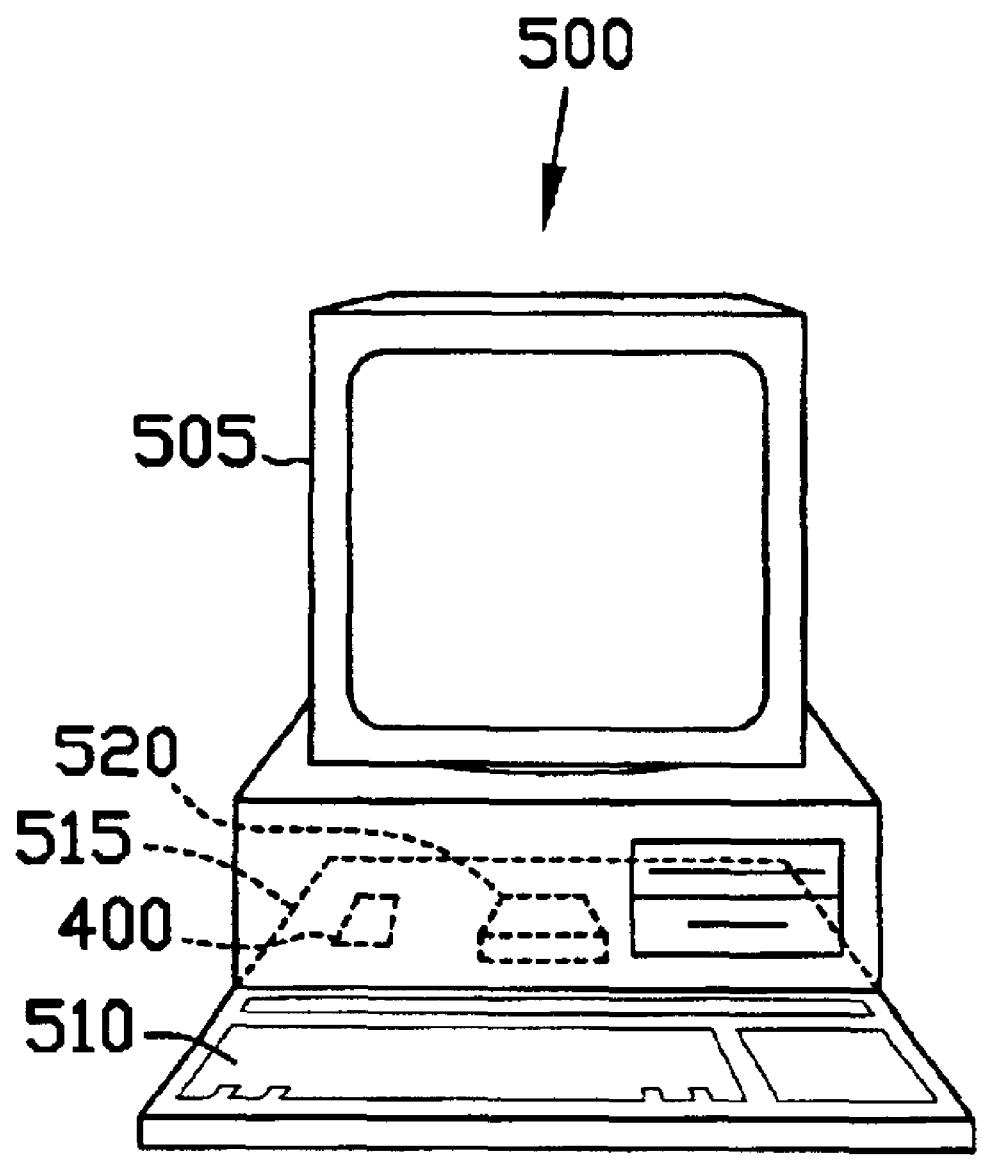
FIG. 5 is a drawing that illustrates generally one embodiment of a computer system according to the present invention.

FIG. 5 is a drawing that illustrates generally, by way of example, but not by way of limitation, one embodiment of a computer system 500 according to the present invention. In one embodiment, computer system 500 includes a monitor 505 or other communication output device, a keyboard 510 or other communication input device, as well as a motherboard 515, carrying a microprocessor 520 or other data processing unit and at least one memory device 400.

Conclusion

As described above, the present invention provides, among other things, a low dielectric constant silicon oxycarbide insulator suitable for isolation on an integrated circuit (IC). The insulator provides electrical isolation, such as between circuit elements, between interconnection lines, between circuit elements and interconnection lines, or as a passivation layer overlying both circuit elements and interconnection lines. The low dielectric constant silicon oxycarbide isolation insulator of the present invention reduces the parasitic capacitance between circuit nodes. As a result, the silicon oxycarbide isolation insulator advantageously provides reduced noise and signal crosstalk between circuit nodes, reduced power consumption, faster circuit operation, and minimizes the risk of potential timing faults.

It is to be understood that the above description is intended to be illustrative, and not restrictive. For example, the above embodiments can be combined. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method, comprising:
   forming a plurality of circuit elements on a substrate;
   coating at least a portion of a surface of the substrate and at least one of the plurality of circuit elements with a mixture of oxide and carbon sources; and
   transforming the mixture of oxide and carbon sources into a silicon oxycarbide having uniformly distributed voids that have an approximate diameter between 20 angstroms and 300 angstroms and which has a dielectric constant less than approximately 2.0.

2. The method of claim 1, wherein the mixture of oxide and carbon sources are selected from the group consisting of polymeric precursors, alkoxysilane, silicon alkoxide, methyldimethoxysilane (MDMS), and tetraethoxysilane (TEOS).

3. The method of claim 1, wherein transforming the mixture of oxide and carbon sources includes removing an excess portion of the silicon oxycarbide by chemical mechanical polishing (CMP) to obtain a desired thickness of the silicon oxycarbide.

4. The method of claim 1, wherein transforming includes hydrolyzing the mixture in the presence of an acid.

5. The method of claim 1, wherein transforming includes pyrolyzing the mixture.

6. A method, comprising:

providing a plurality of circuit elements on a substrate;

coating at least a portion of a surface of the substrate with a mixture of oxide and carbon sources;

transforming the mixture of oxide and carbon sources into a first porous oxycarbide glass dielectric layer on the integrated circuit and insulating first and second of the plurality of circuit elements from each other, the first porous oxycarbide glass dielectric layer having uniformly distributed voids that have an approximate diameter between 20 angstroms and 300 angstroms, wherein the first porous oxycarbide glass dielectric layer has a dielectric constant less than approximately 2.0;

selectively forming vias in the first porous oxycarbide glass dielectric layer for providing connection to the first and second circuit elements;

forming metal layers in the vias and elsewhere on a working surface of the substrate;

patterning and etching the metal layers to provide desired interconnection between the first and second circuit elements and other circuit elements or interconnection lines;

coating at least a portion of a surface of a substrate with a mixture of oxide and carbon sources; and transforming the mixture of oxide and carbon sources into a second porous oxycarbide glass dielectric layer on the integrated circuit.

7. The method of claim 6, wherein the second porous oxycarbide glass dielectric layer has uniformly distributed voids that have an approximate diameter between 20 angstroms and 300 angstroms.

8. The method of claim 6, wherein the second porous oxycarbide glass dielectric layer has a dielectric constant less than approximately 2.0.

9. A method, comprising:

providing a plurality of transistors on a substrate;

coating at least a portion of a surface of the substrate with a mixture of oxide and carbon sources;

transforming the mixture of oxide and carbon sources into a first porous oxycarbide glass dielectric layer on the portion of the substrate surface and insulating first and second of the plurality of transistors from each other, the first porous oxycarbide glass dielectric layer having uniformly distributed voids that have an approximate diameter between 20 angstroms and 300 angstroms;

selectively forming vias in the first porous oxycarbide glass dielectric layer for providing connection to the first and second transistors;

forming metal layers in the vias and elsewhere on a working surface of the substrate;

patterning and etching the metal layers to provide desired interconnection between the first and second transistors and other circuit elements or interconnection lines;

thereafter coating at least a portion of a surface of a substrate with a second mixture of oxide and carbon sources;

transforming the second mixture of oxide and carbon sources into a second porous oxycarbide glass dielectric layer on the substrate; and wherein the second porous oxycarbide glass dielectric layer has a dielectric constant less than approximately 2.0.

10. The method of claim 9, wherein the second porous oxycarbide glass dielectric layer has uniformly distributed voids that have an approximate diameter between 20 angstroms and 300 angstroms.

11. The method of claim 9, wherein the voids of the second porous oxycarbide glass dielectric layer are uniformly distributed.

12. The method of claim 9, wherein the first porous oxycarbide glass dielectric layer has a dielectric constant less than approximately 2.0.

13. A method, comprising:

providing a plurality of circuit elements on a substrate;

coating at least a first portion of a surface of the substrate with a mixture of oxide and carbon sources;

transforming the mixture of oxide and carbon sources into a first porous oxycarbide glass dielectric layer on the first portion of the substrate surface and insulating first and second of the plurality of circuit elements from each other, the first porous oxycarbide glass dielectric layer having essentially uniformly distributed voids that have an approximate diameter between 20 angstroms and 300 angstroms;

selectively forming vias in the first porous oxycarbide glass dielectric layer for providing connection to the first and second circuit elements;

forming metal layers in the vias and elsewhere on a working surface of the substrate;

patterning and etching the metal layers to provide desired interconnection between the first and second circuit elements and other circuit elements or interconnection lines;

coating at least a second portion of a surface of a substrate with a mixture of oxide and carbon sources;

transforming the mixture of oxide and carbon sources into a second porous oxycarbide glass dielectric layer on the second portion of the substrate surface; and wherein the first porous oxycarbide glass dielectric layer has a dielectric constant less than approximately 2.0.

14. A method, comprising:

forming a plurality of circuit elements on a substrate;

coating at least a portion of a surface of the substrate and at least one of the plurality of circuit elements with a mixture of oxide and carbon sources; and transforming the mixture of oxide and carbon sources into a silicon oxycarbide having uniformly distributed voids that have an approximate diameter between 20 angstroms and 300 angstroms and a dielectric constant less than approximately 2.0.

15. The method of claim 14 wherein the mixture of oxide and carbon sources are selected from the group consisting of polymeric precursors, alkoxysilane, silicon alkoxide, methyldimethoxysilane (MDMS), and tetraethoxysilane (TEOS).

16. The method of claim 14, wherein transforming the mixture of oxide and carbon sources includes removing an excess portion of the silicon oxycarbide by chemical mechanical polishing (CMP) to obtain a desired thickness of the silicon oxycarbide.

17. The method of claim 14, wherein transforming includes hydrolyzing the mixture in the presence of an acid.

18. The method of claim 14, wherein transforming includes pyrolyzing the mixture.

19. A method, comprising:

forming a plurality of circuit elements on a substrate;

coating at least a portion of a surface of the substrate and at least one of the plurality of circuit elements with a mixture of oxide and carbon sources; and transforming the mixture of oxide and carbon sources into a silicon oxycarbide having uniformly distributed voids that have an approximate diameter of 30 angstroms and a dielectric constant less than approximately 2.0.

20. The method of claim 19, wherein the mixture of oxide and carbon sources are selected from the group consisting of polymeric precursors, alkoxysilane, silicon alkoxide, methyldimethoxysilane (MDMS), and tetraethoxysilane (TEOS).

21. The method of claim 19, wherein transforming the mixture of oxide and carbon sources includes removing an excess portion of the silicon oxycarbide by chemical mechanical polishing (CMP) to obtain a desired thickness of the silicon oxycarbide.

22. The method of claim 19, wherein transforming includes hydrolyzing the mixture in the presence of an acid.

23. The method of claim 19, wherein transforming includes pyrolyzing the mixture.

24. A method, comprising:

forming a plurality of circuit elements on a substrate;

coating at least a portion of a surface of the substrate and at least one of the plurality of circuit elements with a mixture of oxide and carbon sources; and transforming the mixture of oxide and carbon sources into a silicon oxycarbide having uniformly distributed voids that have an approximate diameter of 200 angstroms.

25. The method of claim 24, wherein the mixture of oxide and carbon sources are selected from the group consisting of polymeric precursors, alkoxysilane, silicon alkoxide, methyldimethoxysilane (MDMS), and tetraethoxysilane (TEOS).

26. The method of claim 24, wherein transforming the mixture of oxide and carbon sources includes removing an excess portion of the silicon oxycarbide by chemical mechanical polishing (CMP) to obtain a desired thickness of the silicon oxycarbide.

27. The method of claim 24, wherein transforming includes hydrolyzing the mixture in the presence of an acid.

28. The method of claim 24, wherein transforming includes pyrolyzing the mixture.

29. A method, comprising:

coating at least a portion of a surface of the substrate with a mixture of oxide and carbon sources; and transforming the mixture of oxide and carbon sources into a silicon oxycarbide having uniformly distributed voids that have an approximate diameter between 20 angstroms and 300 angstroms and which has a dielectric constant less than approximately 2.0.

30. A method, comprising:

coating at least a portion of a surface of the substrate with a mixture of oxide and carbon sources; and transforming the mixture of oxide and carbon sources into a silicon oxycarbide having uniformly distributed voids that have an approximate diameter of 30 angstroms and having a dielectric constant less than approximately 2.0.

31. A method, comprising:

coating at least a portion of a surface of the substrate with a mixture of oxide and carbon sources; and transforming the mixture of oxide and carbon sources into a silicon oxycarbide having uniformly distributed voids that have an approximate diameter of 200 angstroms.

* * * * *